US009219297B2

(12) United States Patent
Schmidhammer

(10) Patent No.: US 9,219,297 B2
(45) Date of Patent: Dec. 22, 2015

(54) AMPLIFIER MODULE WITH MULTIPLE 90 DEGREE HYBRIDS

(75) Inventor: Edgar Schmidhammer, Stein an der Traun (DE)

(73) Assignee: EPCOS AG, Munich (DE)

(*) Notice: Subject to any disclaimer, the term of this patent is extended or adjusted under 35 U.S.C. 154(b) by 10 days.

(21) Appl. No.: 14/002,099

(22) PCT Filed: Mar. 1, 2012

(86) PCT No.: PCT/EP2012/053560
§ 371 (c)(1),
(2), (4) Date: Oct. 31, 2013

(87) PCT Pub. No.: WO2012/117072
PCT Pub. Date: Sep. 7, 2012

(65) Prior Publication Data
US 2014/0049337 A1    Feb. 20, 2014

(30) Foreign Application Priority Data
Mar. 3, 2011    (DE) .................. 10 2011 012 927

(51) Int. Cl.
*H01P 5/18*    (2006.01)
*H03F 1/02*    (2006.01)
(Continued)

(52) U.S. Cl.
CPC ............... *H01P 5/18* (2013.01); *H03F 1/0222* (2013.01); *H03F 3/24* (2013.01); *H03F 3/602* (2013.01); *H04B 1/0483* (2013.01); *H04B 1/52* (2013.01);
(Continued)

(58) Field of Classification Search
CPC ............. H01P 5/12; H03F 3/602; H03F 3/24; H03F 1/00; H03F 1/0222; H03F 3/72; H04B 10/611; H04B 10/614; H04B 1/52; H04B 10/61; H04B 10/63
USPC ................ 333/117, 118, 120, 121, 133
See application file for complete search history.

(56) References Cited

U.S. PATENT DOCUMENTS 3,371,284 A    2/1968 Engelbrecht
4,618,831 A    10/1986 Egami et al.
(Continued)

FOREIGN PATENT DOCUMENTS

CN    1692558 A    11/2005
CN    101427459 A    5/2009
(Continued)

OTHER PUBLICATIONS

Elzayat et al., "Tx/Rx Isolation Enhancement Based on a Novel Balanced Duplexer Architecture", Microwave Symposium Digest (MTT), 2011 IEEE MTT-S International, 2011, pp. 1-4.
(Continued)

*Primary Examiner* — John Poos
(74) *Attorney, Agent, or Firm* — McDermott Will & Emery LLP

(57) ABSTRACT

The invention relates to an amplifier module, comprising at least one amplifier (PA), an antenna port (ANT), a transmission port (TX), a reception port (RX), and a circuit arrangement having at least three 90 DEG hybrids (HYB1, HYB2, HBY3), which each divide a respective input signal into two output signals, wherein the two output signals have a relative phase shift of 90 DEG from each other, wherein the antenna port (ANT), the transmission port (TX), and the reception port (RX) are each connected to at least one 90 DEG hybrid (HYB1, HYB2, HBY3).

23 Claims, 12 Drawing Sheets

(51) Int. Cl.
  *H03F 3/24* (2006.01)
  *H03F 3/60* (2006.01)
  *H04B 1/04* (2006.01)
  *H04B 1/52* (2015.01)

(52) U.S. Cl.
  CPC ..... *H03F 2200/192* (2013.01); *H03F 2200/198* (2013.01); *H03F 2200/204* (2013.01)

(56) References Cited

U.S. PATENT DOCUMENTS

| | | | |
|---|---|---|---|
| 4,656,434 | A | 4/1987 | Selin |
| 5,375,257 | A | 12/1994 | Lampen |
| 6,823,177 | B1 | 11/2004 | Lucidarme |
| 7,123,883 | B2 | 10/2006 | Mages |
| 7,330,500 | B2 | 2/2008 | Kouki |
| 2003/0034835 | A1 | 2/2003 | Poggi et al. |
| 2004/0208137 | A1 | 10/2004 | Martinez |
| 2005/0069026 | A1 | 3/2005 | Vepsalainen et al. |
| 2005/0079835 | A1 | 4/2005 | Takabayashi et al. |
| 2007/0015468 | A1 | 1/2007 | Kouki et al. |
| 2007/0258602 | A1 | 11/2007 | Vepsalainen et al. |
| 2009/0002095 | A1 | 1/2009 | Terada et al. |
| 2009/0108954 | A1 | 4/2009 | Cheung et al. |
| 2009/0268642 | A1 | 10/2009 | Knox |
| 2009/0289720 | A1 | 11/2009 | Takinami et al. |
| 2011/0032854 | A1 | 2/2011 | Carney et al. |
| 2011/0080229 | A1 | 4/2011 | Kenington |
| 2012/0230227 | A1* | 9/2012 | Weiss ............................ 370/277 |

FOREIGN PATENT DOCUMENTS

| | | |
|---|---|---|
| EP | 1492227 A1 | 12/2004 |
| JP | 61-123202 A | 6/1986 |
| JP | 03276912 | 12/1991 |
| JP | 10051323 | 2/1998 |
| JP | 11008560 | 1/1999 |
| JP | 2005020696 A | 1/2005 |
| JP | 2007019827 A | 1/2007 |
| JP | 2008-177956 A | 7/2008 |
| JP | 2008193298 A | 8/2008 |
| JP | 2009182972 A | 8/2009 |
| JP | 2010273215 A | 12/2010 |
| WO | 98/43315 A1 | 10/1998 |
| WO | 03/050947 A1 | 6/2003 |
| WO | 2004/002006 A1 | 12/2003 |
| WO | WO-2009025106 A1 | 2/2009 |

OTHER PUBLICATIONS

Kheirkhahi et al., "Enhanced Class-A/AB Mobile Terminal Power Amplifier Efficiency by Input Envelope Injection and 'Self' Envelope Tracking", Microwave Symposium Digest (MTT), 2011 IEEE MTT-S International, 2011, pp. 1-4.

Laforge et al., "Diplexer Design Implementing Highly Miniaturized Multilayer Superconducting Hybrids and Filters", Applied Superconductivity, IEEE Transactions on Applied Superconductivity, vol. 19 , No. 2, Apr. 2009, pp. 47-54.

Lee et al., "24 GHz Balanced Doppler Radar Front-End with Tx Leakage Canceller for Antenna Impedance Variation and Mutual Coupling", IEEE Transactions on Antenna and Propagation, vol. 59, No. 12, Dec. 2011, pp. 4497-4504.

* cited by examiner

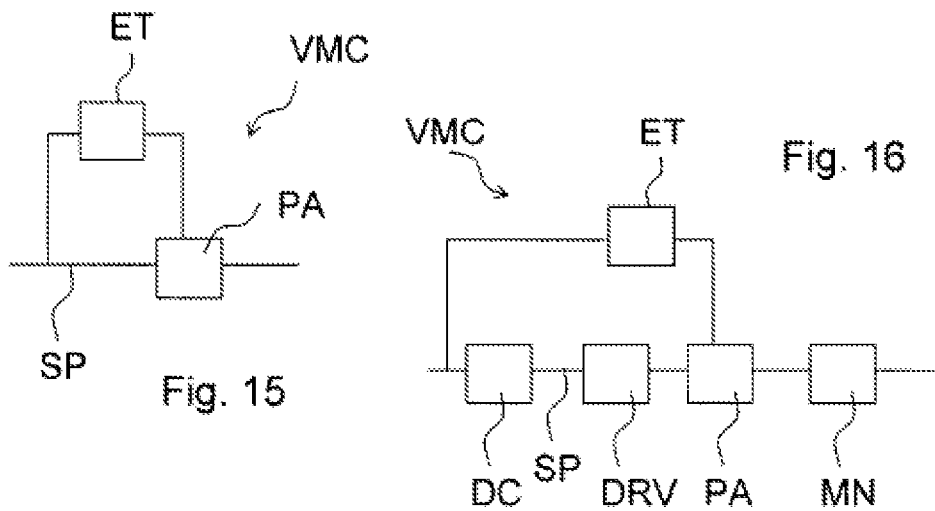
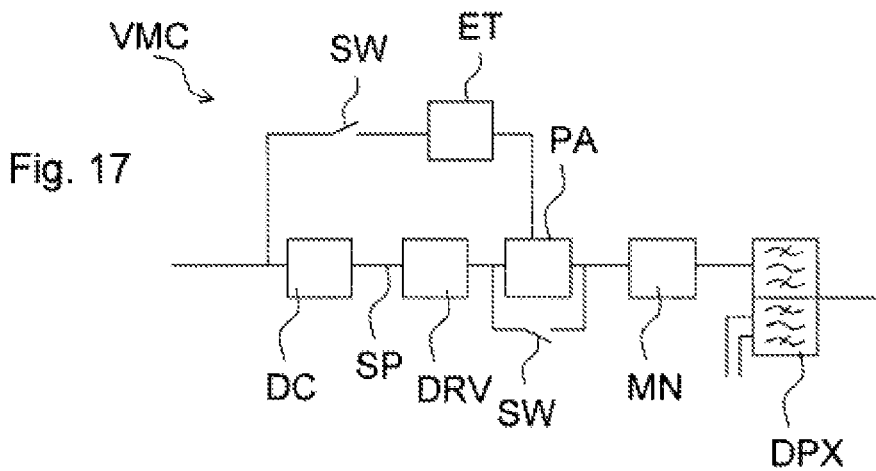
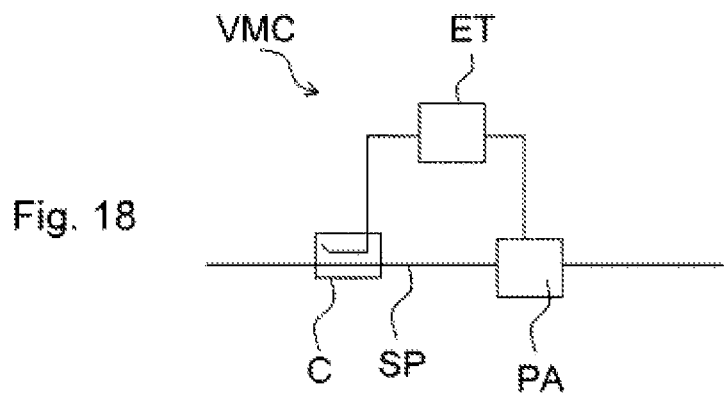

AMPLIFIER MODULE WITH MULTIPLE 90 DEGREE HYBRIDS

The invention relates to an amplifier module comprising one antenna port, one transmission port, one reception port and at least one amplifier.

FIG. 1 shows an amplifier module known in the prior art. It has two amplifiers, two 90° hybrids HYB1, HYB2 and one duplexer DPX1. Furthermore, the amplifier module has an antenna port ANT, a transmission port TX and a reception port RX. The transmission port TX is connected directly to one of the 90° hybrids HYB1. The 90° hybrid HYB1 divides a signal which is present at the transmission port TX into two output signals which have a relative phase shift of 90° with respect to one another.

The two output signals of the first 90° hybrid HYB1 are in each case output into an output path AP1, AP2, an amplifier PA1, PA2 being arranged in each case in each of the two output paths AP1, AP2. The signal in the first output signal path AP1 is phase shifted by 90° compared with the signal in the second output signal path AP2. The two amplifiers PA1, PA2 amplify the respective signal. Each of the two amplifiers PA1, PA2 is connected to a terminal 1, 2 of the second 90° hybrid HYB2. In this second 90° hybrid HYB2, the two output signals are added, the output signal in the first output path AP1 experiencing a phase shift of −90° relative to the output signal in the second output path AP2. Correspondingly, both output signals are now in phase and interfere constructively with one another.

The terminal 3 of the second 90° hybrid HYB2 is connected to an input of the duplexer DPX1. The two other inputs of the duplexer DPX1 are connected to the antenna port ANT or the reception port RX, respectively.

The module shown in FIG. 1 is a so-called I/Q circuit (I=in-phase, Q=quadrature). The output signal of the transmission port TX is initially divided into two branches, there being a 90° phase shift between the two branches. Following this, the signal is amplified in each branch and the amplified signals are now added in such a manner that the phase shift is canceled again and the two signals become constructively superimposed.

Compared with a circuit without 90° hybrids, this circuit has the advantage that the amplification has a more rugged behavior overall. Dividing the signal into two subsignals supplies a signal which, after the amplification, is less distorted than would be the case for a circuit without 90° hybrids.

Further amplification modules for Tx signals which use two hybrids and consequently subsignals divided into two amplifier paths are known, for example, from US patents U.S. Pat. No. 3,371,284 A and U.S. Pat. No. 4,656,434 A.

One essential problem with a circuit according to FIG. 1 is, however, that any mismatch at the antenna is forwarded directly to the subsequent circuit.

Adapting the amplifiers to the antenna is difficult and can also become more problematic due to the 90° hybrids or the two amplifiers connected in parallel. A mismatch of the antenna additionally has a negative effect on the amplifier itself. Correspondingly, the two amplifiers must be designed to be very rugged with regard to mismatches of the antenna impedance.

It is then the object of the present invention to provide an amplifier module which is less severely influenced by a mismatch of the antenna impedance.

The object is achieved by an amplifier module according to the present claim 1. Advantageous embodiments of the invention are found in further claims.

An amplifier module is proposed which has at least one amplifier, one antenna port, one transmission port, one reception port and one circuit arrangement, the circuit arrangement having at least three 90° hybrids which in each case divide an input signal into two output signals, the two output signals having a relative phase shift of 90° with respect to one another and furthermore the antenna port, the transmission port and the reception port being connected in each case to at least one 90° hybrid. At least one of the amplifiers is interconnected in series between the transmission port and one of the 90° hybrids.

By means of the module according to the invention, the effects of a mismatch with an antenna can be reduced greatly. Correspondingly, the sensitivity of reception in a receiving path can be increased distinctly. Furthermore, the circuit arrangement according to the invention improves the isolation between a transmission port and a reception port.

In an exemplary embodiment, the circuit arrangement also has at least two duplexers. The duplexers can be interconnected in such a manner that the two output signals which the 90° hybrid connected to the transmission port outputs interfere constructively at the antenna port. Correspondingly, a transmitted signal is initially divided into two subsignal paths. Correspondingly, only half the signal strength is present at each of the two duplexers compared with a circuit having only one duplexer as shown in FIG. 1. Therefore, duplexers can be used which have a power compatibility reduced by 3 dB. This results directly in a reduced space requirement for the module. Furthermore, resonator cascades can be omitted in the duplexers at least partially so that both the isolation of transmission and reception port and a standing wave ratio VSWR of the duplexers can be improved. Additionally, the linearity of the duplexers is improved.

In an exemplary embodiment, the three terminals of each of the two duplexers are connected in each case to one of the three 90° hybrids. In this context, the terminals can be connected directly to the respective 90° hybrid. As an alternative, one or more elements of the circuit arrangement can also be arranged between the 90° hybrid and the respective duplexer terminal. For example, an amplifier can be arranged between a 90° hybrid and a duplexer. Furthermore, elements for matching the individual stages to one another can be contained.

In one embodiment, one of the two duplexers is connected to the 90° hybrid which is connected to the reception port and to the 90° hybrid which is connected to the transmission port in such a manner that these two 90° hybrids in each case output to the duplexer an output signal phase shifted by an angle $\Phi_1$ relative to their input signal. Furthermore, the other one of the two duplexers can be connected to the 90° hybrid which is connected to the reception port and to the 90° hybrid which is connected to the transmission port, in such a manner that these two 90° hybrids in each case output an output signal shifted by the angle $\Phi_2$ relative to their input signal to the duplexer. The amount of the difference of the two angles $\Phi_1$ and $\Phi_2$ can be mainly 90° and the two duplexers can be connected in each case to one of the outputs of the 90° hybrid connected to the antenna port.

Such an interconnection guarantees that the signals coupled in at the transmission port interfere constructively at the antenna port and interfere destructively at the reception port. A certain proportion of the transmitted signals always reaches the reception port as a parasitic signal. Due to the destructive interference of the parasitic signals, the sensitivity of reception and the isolation of transmission and reception port can be increased.

The duplexers can be constructed of discrete elements or contain acoustic components. The duplexers can be acoustic components, especially SAW duplexers (surface acoustic wave) or BAW duplexers (bulk acoustic wave). Furthermore, a hybrid duplexer can also be used which has SAW and BAW transducers. As an alternative, duplexers of discrete elements are also possible and duplexers, the transmission and reception filters of which use different technologies, so-called hybrid duplexers. Furthermore, the duplexers can also have combinations of high-pass filters and low-pass filters.

Furthermore, the duplexers can be designed in such a manner that they are tunable in their frequency. Such a so-called "tunable duplexer" allows the pass band of the duplexer to be shifted within a tuning range and thus to be adapted to the transmission and reception channels required in each case. Such a duplexer has tunable elements.

The module according to the invention can also be designed for different frequency bands without using tunable duplexers, the circuit arrangement comprising two duplexers per frequency band and having means for switching between the various duplexers and frequency bands. In this context, it is also possible that the circuit arrangement has a separate reception port and its own 90° hybrid for each frequency band, the means for switching optionally connecting the transmission port to duplexers allocated to the different frequency bands.

The duplexers and/or the 90° hybrids can be mounted as discrete components on the module substrate or integrated at least partially into the module substrate in the form of patterned metalizations. Furthermore, components which enable the duplexers to be adjusted to different frequencies can be integrated in the module substrate. This includes, for example, switches or tunable components. Duplexers and 90° hybrids can be integrated into a multi-layered module substrate, in particular, in the form of L-, C- and R-elements.

A 90° hybrid is a circuit network comprising four terminals 101, 102, 103, 104. The operation is explained by means of a 90° hybrid of discrete elements as shown in FIG. 2. The 90° hybrid is constructed symmetrically. A signal is applied to terminal 101. The connection of terminal 101 to terminal 102 then becomes the main line 105. The main line has an inductance 106. This inductance 106 is coupled magnetically to a further inductance 107 in a secondary line 108. Correspondingly, a proportion of the input signal is coupled out of the main line 105 and coupled into the secondary line 108. The terminal 104 is connected to an impedance Z0 and terminated by this impedance. If the impedances of terminals 102 and 103 are correspondingly matched, almost the entire signal coupled in at terminal 101 is coupled out at these two terminals 102, 103. Correspondingly, almost no signal component is output at terminal 104 and the latter is virtually isolated.

The signals which are output at the two terminals 102 and 103 are phase shifted relative to one another. The relative phase shift with respect to one another is 90° +Δn. Δn is 0° for an ideal 90° hybrid. In a real 90° hybrid, Δn is usually about ±3°.

In the most general case, the 90° hybrid outputs at terminal 102 a signal which is phase shifted by the angle $\Phi_1$ compared with the input signal, whilst at terminal 103, a signal is output which is phase shifted by the angle $\Phi_2$ compared with the input signal. In the case of an ideal 90° hybrid, $|\Phi_2 - \Phi_1| = 90°$ also applies. The angles $\Phi_1$ and $\Phi_2$ can assume, for example, the values of 0° and 90° or the values of −45° and +45°.

Via the coupling constant of the magnetic or inductive coupling it is possible to adjust which signal component is extracted from the main line 105 and injected into the secondary line 108.

Various alternatives are known with respect to a 90° hybrid which is constructed of discrete elements. A 90° hybrid can be constructed, for example, of microstrip lines such as the so-called Lange coupler or at least comprise microstrip lines. A further possibility is a branch line coupler. The principle of operation always remains unchanged, however. A certain signal component is extracted from a main line and injected into a secondary line. A terminal of this secondary line is matched in its impedance so that a phase shifted signal is output here. The other terminal is isolated. If no impedance matching is carried out, a not negligible signal component is output also at the isolated terminal The 90° hybrid is essentially used for the following two functions: an input signal which is present at a first terminal of a 90° hybrid is output again in the form of two output signals at two further terminals. The output signals have in each case about half the signal strength of the input signal and therefore have a signal strength which is in each case lower by about 3 dB than the signal strength of the input signal. In the case of an ideal 90° hybrid, the signal strength of the two output signals is lower by exactly 3 dB. In the case of a real 90° hybrid, however, this value is not achieved precisely due to losses. In addition, there is a relative phase shift of about 90° between the two output signals.

In a manner which complements this, a 90° hybrid can also be used for adding two signals which are present at two terminals. In this context, one of the signals is phase shifted by 90° before the addition.

Furthermore, a 90° hybrid has a fourth terminal If an input signal is applied to a first terminal, an output signal having a signal strength which is lower by about 3 dB is output at the second and third terminal At the fourth terminal, no signal is output, as a rule. In this context, however, it is assumed that there is an impedance match between all four terminals of the 90° hybrid. If the impedance of the terminals is not matched, a not negligible signal component is output via the fourth terminal.

The four terminals are frequently designated by "Input", "Output 1", "Output 2" and "Isolated" in accordance with their function. Since a 90° hybrid is symmetrically constructed, each of the four terminals can assume any of the "Input", "Output 1", "Output 2" or "Isolated" functions. This only depends on the terminal to which an input signal is applied.

In a preferred embodiment of the invention, the three terminals of each of the two duplexers are in each case connected to a 90° hybrid. In this arrangement, a 90° hybrid is arranged in each case between transmission, reception and antenna port and the two duplexers. Correspondingly, a signal having signal strength which is lower by about 3 dB is present in each case at the two duplexers, compared with a circuit in which transmission, reception and antenna port are connected directly to a duplexer. The result is that it is now possible to use duplexers which only withstand a lower maximum power. Such duplexers frequently offer advantages, for instance a smaller size, a simpler configuration and thus a lower price or, alternatively, at the same price, a better insertion loss in the pass band.

In this embodiment, one of the two duplexers is connected to the 90° hybrid at the reception port in such a manner that this 90° hybrid outputs an output signal which is phase shifted by the angle $\Phi_1$ relative to its input signal from the reception port, to the duplexer. This first duplexer is also connected to the 90° hybrid at the transmission port in such a manner that this 90° hybrid outputs an output signal phase shifted by the angle $\Phi_1$ relative to its input signal from the transmission port to the duplexer. In this manner, a first signal path from the transmission port to the reception port is defined at which a total phase shift of twice $\Phi_1$ is produced.

Furthermore, the other one of the two duplexers is connected here to the 90° hybrid connected to the reception port, in such a manner that this 90° hybrid outputs an output signal phase shifted by the angle $\Phi_2$ relative to its input signal from the reception port to the duplexer. This other one of the two duplexers is also connected to the 90° hybrid connected to the transmission port, in such a manner that this 90° hybrid outputs an output signal phase shifted by the angle $\Phi_2$ relative to its input signal from the transmission port to the duplexer. In this second path between reception port and transmission port, too, the phase shifts add in such a manner that a total phase shift of twice $\Phi_2$ is produced for the signal.

Correspondingly, there are now two signal paths between transmission and reception port which have a phase shift of twice $\Phi_1$ or twice $\Phi_2$, respectively, relative to the signal which has been output by the transmission port. The 90° hybrids are set in such a manner that the amount of the difference of the angles $\Phi_1$ and $\Phi_2$ is about $90°|\Phi_1-\Phi_2|\approx90°$. In this case, the two signal paths have a relative phase shift of 180° with respect to one another. This results in a destructive interference at the reception port so that the two signals virtually cancel each other. Ideally, the two signals cancel each other by 100% with a symmetric configuration with two constructionally identical duplexers and equal path length of the signal paths.

Furthermore, both duplexes are in each case connected to one of the outputs of the hybrid connected to the antenna port in this embodiment.

The circuit arrangement according to the invention enables the isolation of transmission and reception channel to be improved. In addition, EVM (error vector magnitude), VSWR Tx and VSWR Rx, the stability of suppression (remote deselection) in the case of load changes at the antenna and the amplitude ripple in the pass band are improved and the group delay is stabilized. Correspondingly, it is now also possible to use duplexers which, taken by themselves, do not deliver adequate isolation of the two channels. This includes especially duplexers which are designed to be frequency-tunable. Such a so-called tunable duplexer allows the pass band of this duplexer to be shifted within a tuning range and thus to be adapted to the transmission and reception channels required in each case. By means of the circuit arrangement according to the invention, the isolation between transmission and reception port can be maximized even with tunable duplexers.

The 90° hybrids can be constructed of discrete elements or as microstrip lines. 90° hybrids which are built as microstrip lines are also called Lange couplers.

In one embodiment, the amplifier module has two amplifiers, wherein the first amplifier is interconnected in series between the 90° hybrid which is connected to the transmission port, and the first duplexer, and wherein the second amplifier is interconnected in series between the 90° hybrid connected to the transmission port, and the second duplexer.

In a further embodiment, the amplifier module only has one amplifier which is interconnected in series between the transmission port and one of the 90° hybrids.

In one embodiment, one of the ports is designed to be balanced and has two mutually symmetric terminals, both of which are connected to one 90° hybrid each. This can be both the transmission port and the reception port. It is also possible to construct both ports to be balanced and to connect the corresponding mutually symmetric terminals to one 90° hybrid each.

In general, further ports can be provided in the amplifier circuit of the amplifier module, all of which ports are connected to one hybrid each. If one of the ports has a further terminal, this further terminal, too, is connected to a hybrid. It can thus be stated in the most general form that N hybrids are provided for N terminals, N being an integral number greater than or equal to three.

Deviating from the principle of the 90° hybrids, it is also possible to use asymmetric hybrids which generate other phase rotations so that $|\Phi_1-\Phi_2|\neq90°$. These asymmetric hybrids can then be interconnected with one another in such a manner that the phase rotation of about 180°, needed for improving the isolation, is obtained by the interconnection. In this case, too, the isolation is improved.

The circuit according to the invention can be used, for example, for signal transmission in the LTE frequency bands XI and VII. The LTE frequency band XI has a transmitting range of 1427.9 to 1452.9 MHz and a receiving range of 1475.9 to 1500.9 MHz. The transmitting range of the LTE frequency band VII extends from 2500 to 2570 MHz and the associated receiving range extends from 2620 to 2690 MHz. Furthermore, it is possible to use the circuit in band XIII, the transmitting band of which extends from 777 to 787 MHz and the receiving band of which extends from 746 to 756 MHz. However, the circuit is suitable in principle also for other LTE bands.

Mobile telephones often have amplifier circuits which are tuned either for a frequency band around 1 GHz or for a frequency band around 2 GHz. Such amplifier circuits cannot cover the LTE frequency bands XI and VII. They could, therefore, be supplemented ideally by an amplifier module according to the invention which is designed precisely for the frequencies of these frequency bands.

It is possible that all circuit elements, e.g. the 90° hybrids or the amplifiers, have inputs or outputs matched to a certain impedance, e.g. 50 Ω.

In one embodiment, at least one amplifier of the amplifier module and/or at least one 90° hybrid comprises a low-impedance output stage.

Power amplifiers, in particular, generally have an output impedance which is lower than 50 Ω. Amplifiers, or their output stages, respectively, can have output impedances within a range of about 2 Ω to 10 Ω. I/Q amplifiers can have a higher output impedance which can still be lower than 50 Ω. I/Q amplifiers can have, e.g., output impedances having values of <20 Ω, e.g. 10 to 20 Ω.

It is possible, therefore, to obtain an amplifier module having an improved performance and especially improved efficiency if amplifiers having an output impedance which is different from 50 Ω are used.

It is possible to connect an impedance matching network to the low-impedance output of an amplifier in order to adapt the impedance to the 50 Ω impedance provided for the remaining circuit. However, it is also possible to match the circuit following the corresponding amplifier so that its input impedance corresponds to the low output impedance of the amplifier.

In one embodiment, an amplifier module comprises an impedance transformation network after one of the amplifiers and/or one of the 90° hybrids.

In one embodiment, the amplifier module comprises an I/Q amplifier having two parallel-connected amplifier units and two 90° hybrids. In this arrangement, an I/Q amplifier is an amplifier which comprises two amplifier units which can be connected in parallel, and two 90° hybrids. In this arrangement, the two amplifier units are generally interconnected in parallel-connected paths between two 90° hybrids.

The amplifier units of the amplifier and the 90° hybrids can have input impedances and output impedances which are lower than 50 Ω so that an improved performance and especially improved efficiency is obtained.

In one embodiment, the amplifier module comprises a first impedance transformation network interconnected with a first output of a 90° hybrid and a second impedance transformation network interconnected with a second output of a 90° hybrid. In this context, the impedance transformation networks can be interconnected at their outputs with the two duplexers of the amplifier module and transform the operating impedance of the amplifier and/or of the 90° hybrid interconnected with the amplifier to the operating frequency of the duplexers. Although it is necessary in this solution to provide two different impedance transformation networks, the advantage of an improved efficiency generally cancels this disadvantage again due to additional costs.

In one embodiment, the amplifier module comprises a first amplifier unit interconnected between a first output of a 90° hybrid and a first impedance transformation network and a second amplifier unit interconnected between a second output of a 90° hybrid and a second impedance transformation network.

It is then possible that the 90° hybrid has an output impedance which corresponds to the input impedance of the amplifier units of the amplifier, wherein these impedances can be lower than 50 Ω. In any case, the output impedance of the amplifier units is transformed by the impedance transformation networks to the operating impedance of the duplexers interconnected with these.

In one embodiment, the amplifier module comprises a voltage modulator for an amplifier or an amplifier unit.

It has been found that the above-mentioned embodiments of amplifier modules can operate even more efficiently if the supply voltage of the amplifiers is matched to the respective power situation. In this supply voltage envelope tracking, the supply voltage of an RF amplifier is matched to the instantaneous output power. If the output power is low, the supply voltage is reduced. If, in contrast, the output power is high, the supply voltage is correspondingly increased. As a result, the power amplifier ideally always operates close to its maximum output power and thus more efficiently. In this arrangement, a key component of the supply voltage envelope tracking can be a voltage modulator which preferably has a high efficiency and is itself a power amplifier which, in contrast to the RF amplifier, amplifies a low-pass signal. In supply voltage envelope tracking, the output power changes with frequencies which are derived from the tones of the acoustic signals to be transmitted. The frequencies of the voltage envelope tracking are, therefore, generally audio frequencies. In the case of low frequencies, it is simpler to construct efficient power amplifiers so that a highly efficient voltage modulator can be obtained easily.

It is possible to use techniques of DC/DC converters or amplifier principles known from audio technology for the voltage modulators.

Supply voltage envelope tracking is known, for example, from the article "Enhanced Class-A/AB Mobile Terminal Power Amplifier Efficiency by Input Envelope Injection and 'Self' Envelope Tracking" by Alireza Kheirkhahi, Peter M. Asbeck and Laurence E. Larson (C2011 IEEE). However, feedbacks by TX signals reflected from the antenna which heterodyne with the actual TX signal delivered directly by the amplifier have hitherto been problematic. The heterodyning results in mismatches which corrupts the envelope curve which specifies the corresponding power which an amplifier has to produce. The operation of the supply voltage envelope tracking is thus greatly limited.

In principle, it is possible to match the impedance of the signal path and of the antenna via an impedance matching circuit so that the envelope curve is less corrupted. However, such impedance matching circuits mean higher production costs. Furthermore, space is often simply lacking in mobile communication devices subject to the trend toward miniaturization.

The use of supply voltage envelope tracking together with one of the above-mentioned amplifier modules renders the use of an impedance matching circuit superfluous since the interconnection of hybrids and duplexers produces an intrinsic impedance match which meets the requirements for supply voltage envelope tracking. In other words: the provision of one of the above-mentioned amplifier modules with the interconnection of hybrids/90° hybrids and duplexers has the effect that the terminating impedance of the amplifier scarcely varies so that the amplifier is optimally loaded and there is no corruption of the TX signal due to reflection at the antenna. In this context, terminations of the hybrids interconnected with ground can derive the reflected signals via impedance elements such as, e.g., resistors.

Although additional circuit components must be provided for the supply voltage envelope tracking, which, in turn, have a certain current consumption, an amplifier module optimized for consumption can be obtained overall which produces advantages with respect to the period of use of the power supply especially when using LTE transmission systems.

In one embodiment, the amplifier module comprises a coupler for extracting a control signal for envelope tracking of the supply voltage of an amplifier or of an amplifier unit.

In this context, a particular percentage of the power of the RF signal is extracted from the signal path and used for determining the power level of the amplifier. This signal, amplified itself, is provided to the amplifier or an amplifier unit of the amplifier as supply voltage. The supply voltage of the amplifier is thus power-dependent so that the amplifier itself always operates at an optimum operating point.

In one embodiment, the amplifier module comprises a detector for detecting the necessary supply voltage of an amplifier or of an amplifier unit.

In this context, the detector can comprise an interconnection of diodes and/or semiconductor switches.

In one embodiment, the amplifier module comprises a delay element in the signal path before an amplifier or an amplifier voltage.

Determining the current supply voltage requires a certain time interval At by which the RF signal must be delayed in the signal path so that the adapted supply voltage and the RF signal are present synchronously at the amplifier in the signal path in which the power amplifier is interconnected.

In one embodiment, the amplifier module comprises circuit elements for a supply voltage envelope tracking and a switch for deactivating the circuit elements for the supply voltage envelope tracking.

If it is foreseeable that the supply voltage envelope tracking is not needed, for instance because it can be predicted which power level will be called up by the amplifier, energy can be saved furthermore in that the corresponding circuit elements of the supply voltage envelope tracking are deactivated. Naturally, it is possible to reactivate the circuit elements for supply voltage envelope tracking if they can contribute again to energy saving.

In the text which follows, the invention will be explained in greater detail with reference to exemplary embodiments and the associated figures. The figures show various exemplary embodiments of the invention by means of diagrammatic representations not true to scale.

FIG. 15 shows a block diagram of a simple embodiment of the supply voltage envelope tracking.

FIG. 16 shows an embodiment of circuit elements of a supply voltage envelope tracking.

FIG. 17 shows a further embodiment of the circuit elements of a supply voltage envelope tracking.

FIG. 18 shows circuit elements of supply voltage envelope tracking comprising a coupler.

Figure 1:
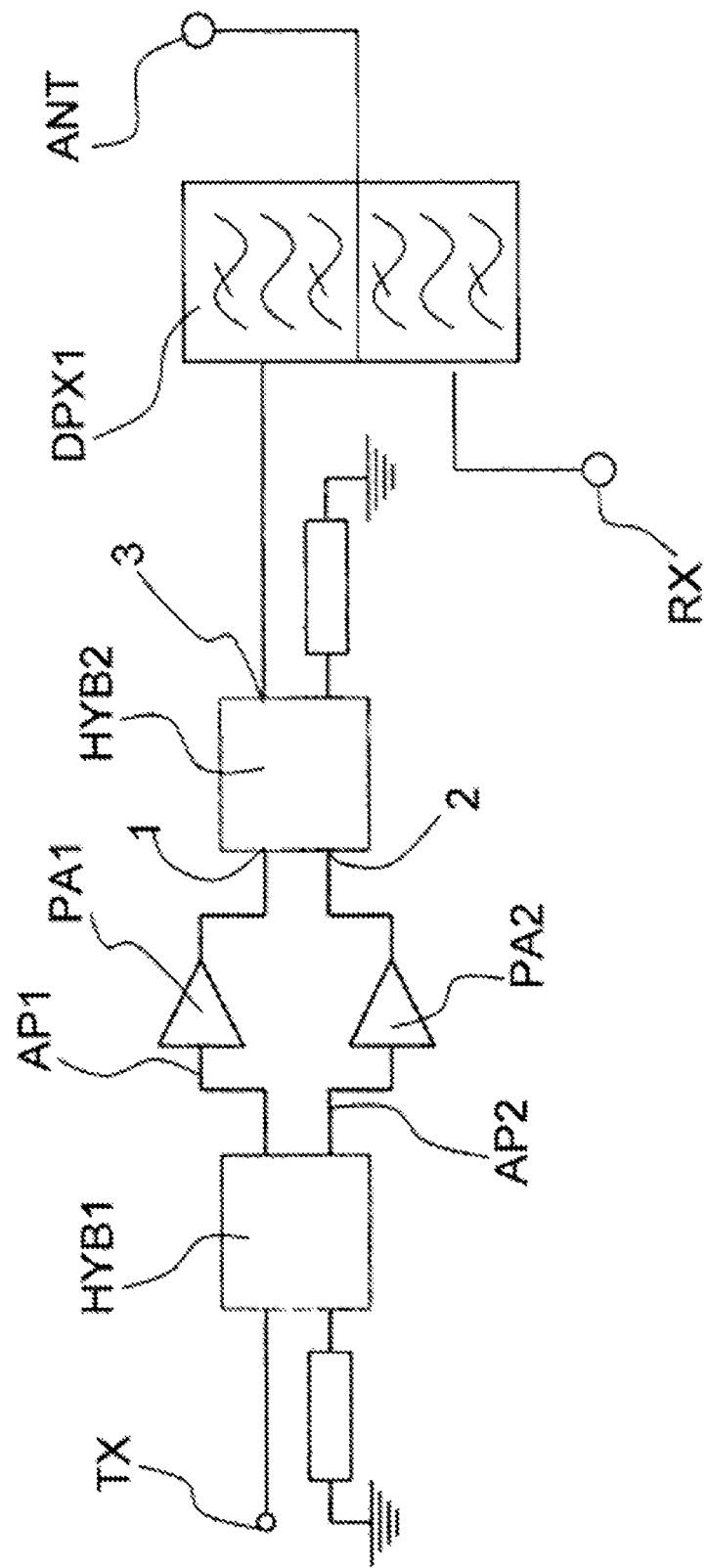
FIG. 1 shows an amplifier module known in the prior art.
Figure 2:
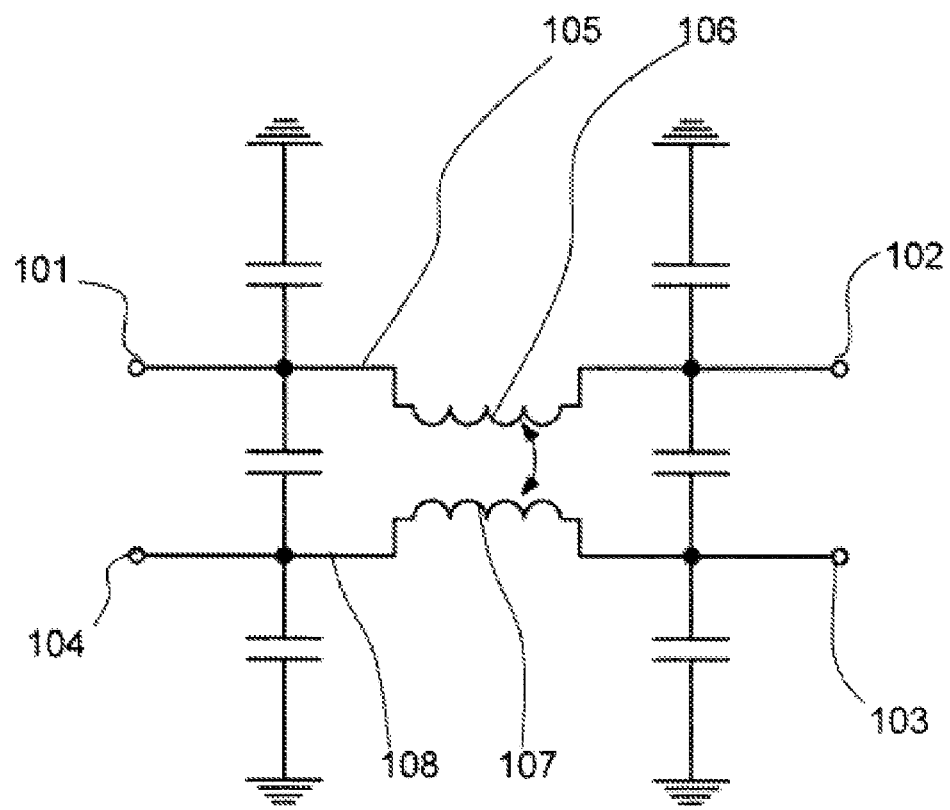
FIG. 2 shows a known 90° hybrid of discrete elements.
Figure 3:
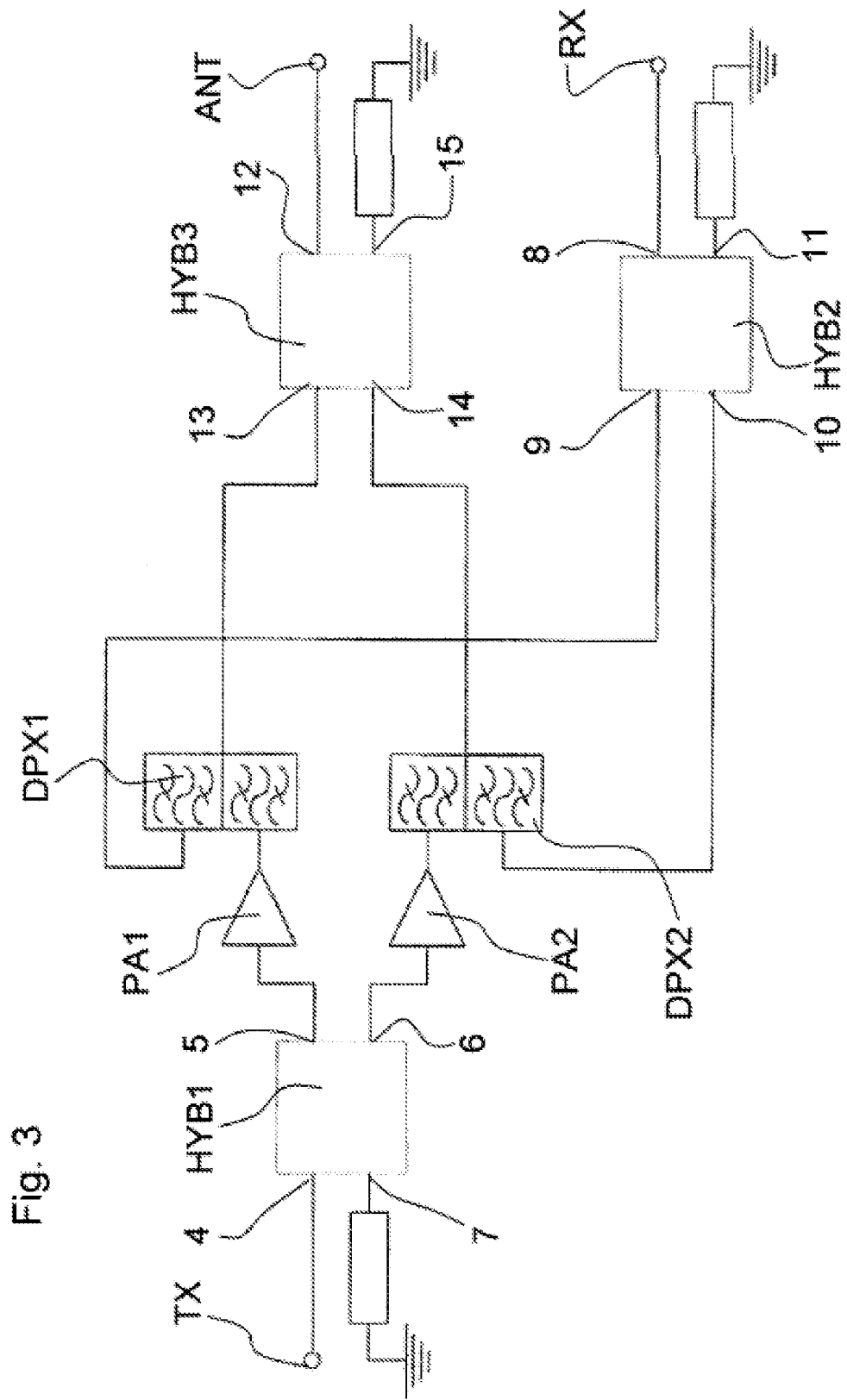
FIG. 3 shows a first embodiment of the amplifier module according to the invention.

FIG. 3 shows a first exemplary embodiment of the amplifier module according to the invention. The amplifier module has a transmission port TX, an antenna port ANT and a reception port RX. Such a circuit arrangement can be used, for example, in a mobile radio. In this case, transmission and reception port TX, RX are connected to the same antenna port ANT via various paths. Decisive characteristics of such a circuit are the selectivity and the isolation. The isolation is a measure of which proportion of a transmitted signal from the transmission port TX reaches the reception port RX. Such a signal is usually unwanted. The signals received from the reception port RX only have a very low signal strength in mobile radio. It is therefore decisive that these signals are not additionally also disturbed by a parasitic signal from the transmission port TX.

The selectivity describes the ratio between the radiated power in the pass band and the attenuation outside the pass band. Due to the received powers, which are very low in mobile radio, a high selectivity of received signal and transmitted signal is important.

A further decisive variable is the effect of a mismatch of the antenna impedance. The impedance of an antenna can be altered by interaction of a user. An amplifier module should be designed in such a manner that it is as independent as possible of fluctuations of the antenna impedance.

The amplifier module according to the invention also has two duplexers DPX1, DPX2 and three 90° hybrids HYB1, HYB2, HYB3. The transmission port TX is connected to one terminal 4 of a 90° hybrid. An input signal which is present at this terminal 4 is output by the 90° hybrid HYB1 at terminals 5 and 6, the signals output being phase shifted by 90° with respect to one another and having a signal strength which is lower by about 3 dB compared with the input signal.

At terminal 5, a signal is output which is phase shifted by $\Phi_2$ compared with the input signal of the 90° hybrid. The signal output at terminal 6 is phase shifted by the angle $\Phi_1$ compared with the input signal. Furthermore, a load impedance, for example a load resistor of 50Ω, is present at the fourth terminal 7 of the 90° hybrid HYB1. The load impedance can also comprise other elements selected from R, L and C elements. This load impedance provides for impedance matching. Terminals 5 and 6 of the 90° hybrid HYB1 are in each case connected to an amplifier PA1, PA2. The outputs of the amplifiers PA1, PA2 are in turn connected in each case to one of the two duplexers DPX1, DPX2.

The reception port RX is also connected to a 90° hybrid HYB2, i.e. to a terminal 8 of this 90° hybrid HYB2. Terminals 9 and 10 of this 90° hybrid are also connected in each case to one of the two duplexers DPX1, DPX2. The fourth terminal 11 of the 90° hybrid HYB2 is grounded via a load impedance.

The antenna port ANT is connected to a 90° hybrid HYB3, i.e. to terminal 12 of the 90° hybrid. Two further terminals 13, 14 of this 90° hybrid HYB3 are in each case connected to a duplexer. The fourth terminal 15 of the 90° hybrid HYB3 is grounded via a load impedance.

The 90° hybrids HYB1, HYB2, HYB3 and the duplexers DPX1, DPX2 are interconnected with one another in such a manner that transmitted signals which reach the reception port RX due to a finite isolation of the duplexers DPX1, DPX2 ideally cancel each other. At the same time, transmitted signals which reach the antenna port ANT on different signal paths interfere constructively.

Figure 4:
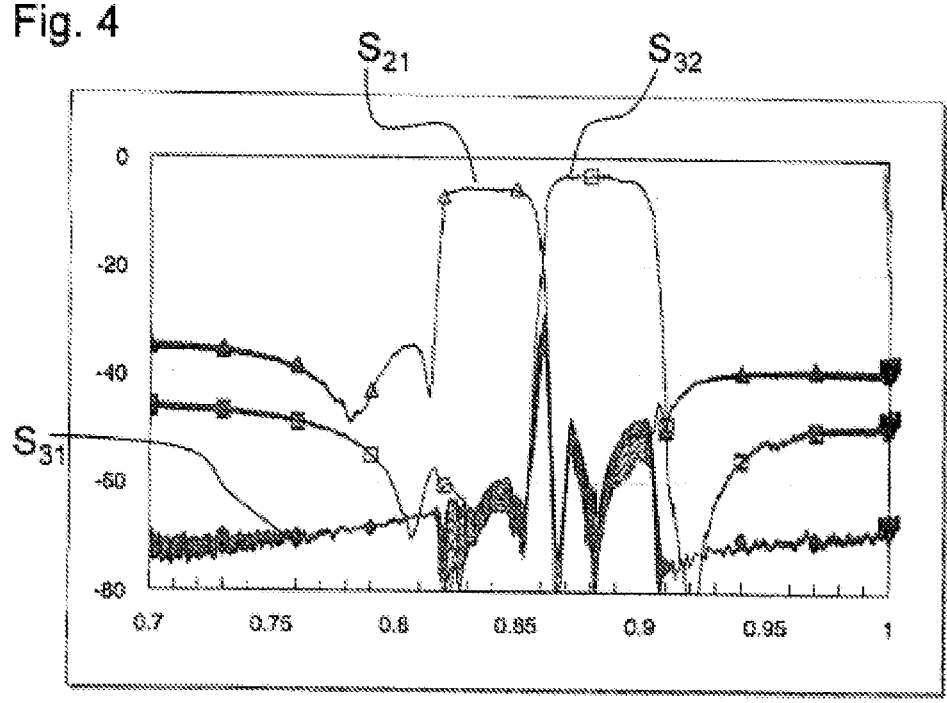
FIG. 4 shows the pass-band characteristic and isolation of the circuit shown in FIG. 3.

FIG. 4 shows the pass-band characteristic for an amplifier module according to the first embodiment. An amplifier module is considered in which a standing-wave ratio of 3:1 is present at the antenna. The phase angle is increased incrementally from 0° to 360° in 20° steps so that a family of curves is produced which is shown in FIG. 4.

Curve $S_{21}$ describes the insertion loss of the TX filter, i.e. the transmissivity from the transmission port TX to the antenna port ANT in dependence on the frequency of the signal. Curve $S_{32}$ describes the insertion loss of the RX filter, i.e. the transmissivity from the antenna port ANT to the reception port RX in dependence on the frequency of the signal. Curve $S_{31}$ describes the isolation of the duplexer, i.e. the transmissivity of the signal from transmission port TX to reception port RX.

Figure 5:
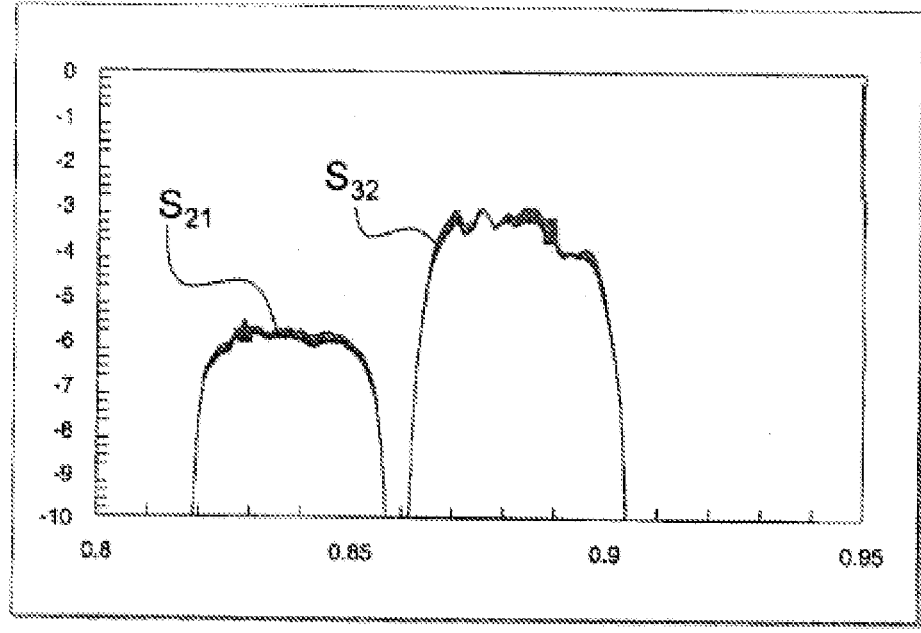
FIG. 5 shows a section of FIG. 4.

FIG. 5 shows an enlargement of a section from the pass-band characteristic shown in FIG. 4. In FIG. 5, the pass band of the TX filter and the pass band of the RX filter are shown.

Figure 6:
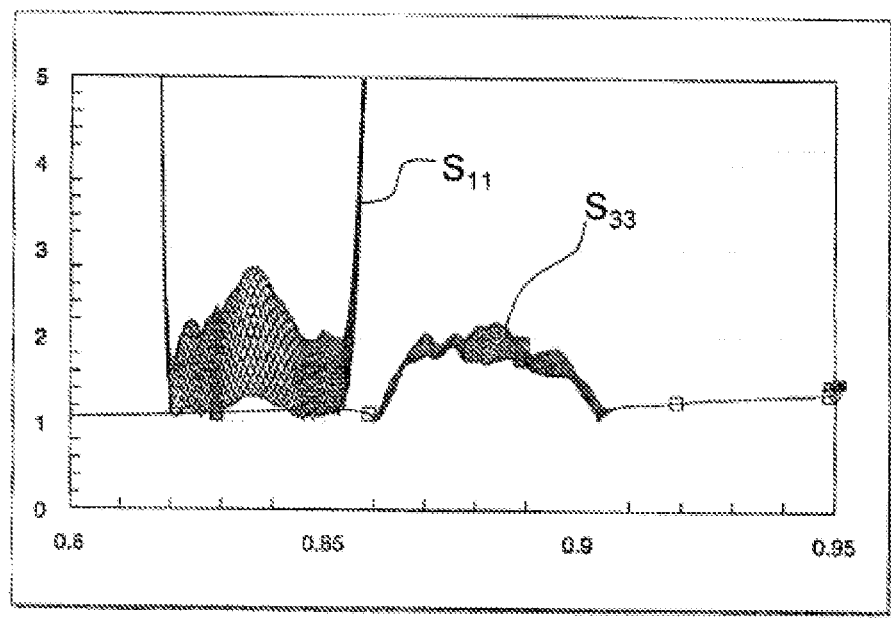
FIG. 6 shows the reflection of the circuit according to FIG. 3.

FIG. 6 shows curves $S_{11}$ and $S_{33}$ for an amplifier module shown in FIG. 3. Here, too, a standing-wave ratio of 3:1 at the antenna is used as a basis. The phase angle is increased incrementally in 20° steps from 0° to 360°, resulting in a family of curves which is shown in FIG. 6.

Curve $S_{11}$ describes the signal component which is reflected at a transmission port TX. Curve $S_{33}$ describes the signal component which is reflected at a reception port RX.

Figure 7:
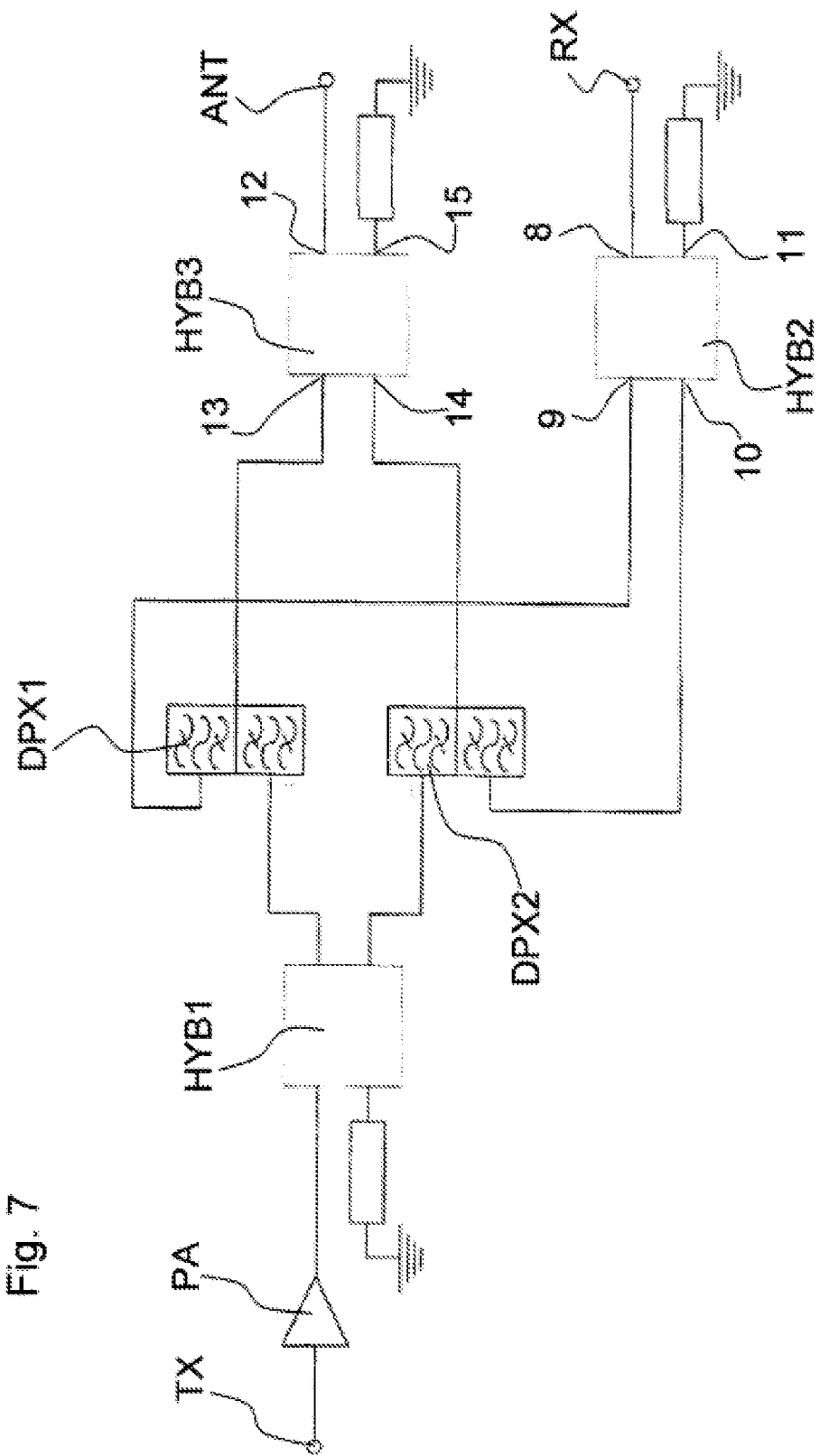
FIG. 7 shows a second embodiment of the amplifier module according to the invention.

FIG. 7 shows a second exemplary embodiment of the present invention. Compared with the first exemplary embodiment, the two amplifiers PA1, PA2 are removed and replaced by a single amplifier PA which is arranged in series between the transmission port TX and the 90° hybrid HYB1 connected to the transmission port TX.

Figure 8:
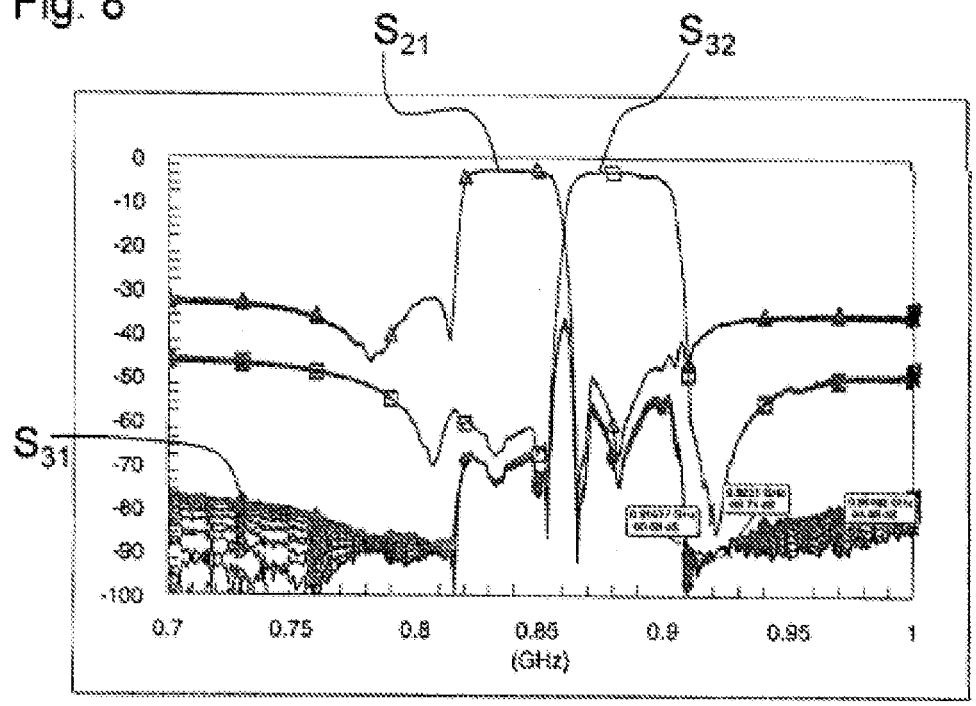
FIG. 8 shows the pass band characteristic and isolation of an amplifier module according to FIG. 7.
Figure 9:
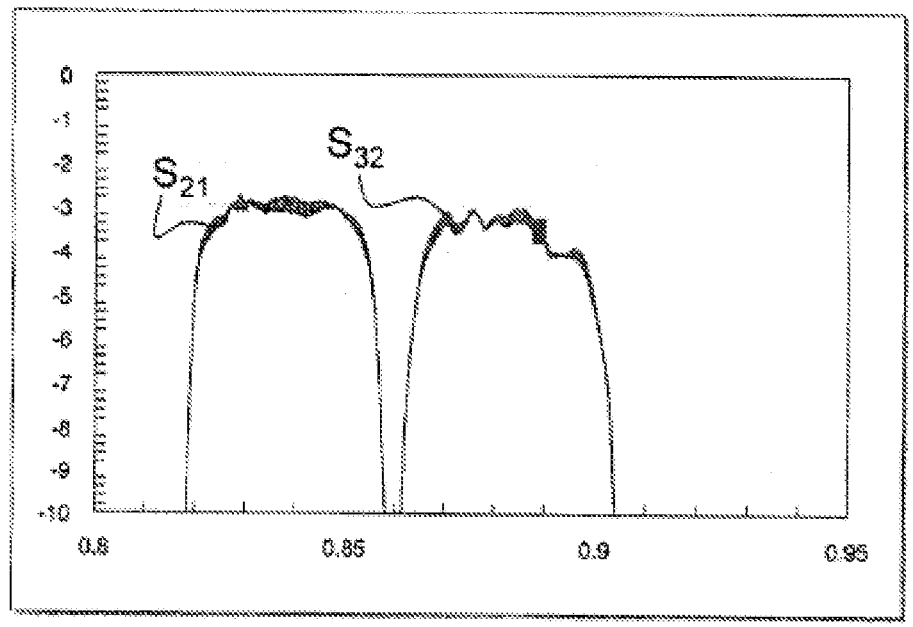
FIG. 9 shows a section from FIG. 8.
Figure 10:
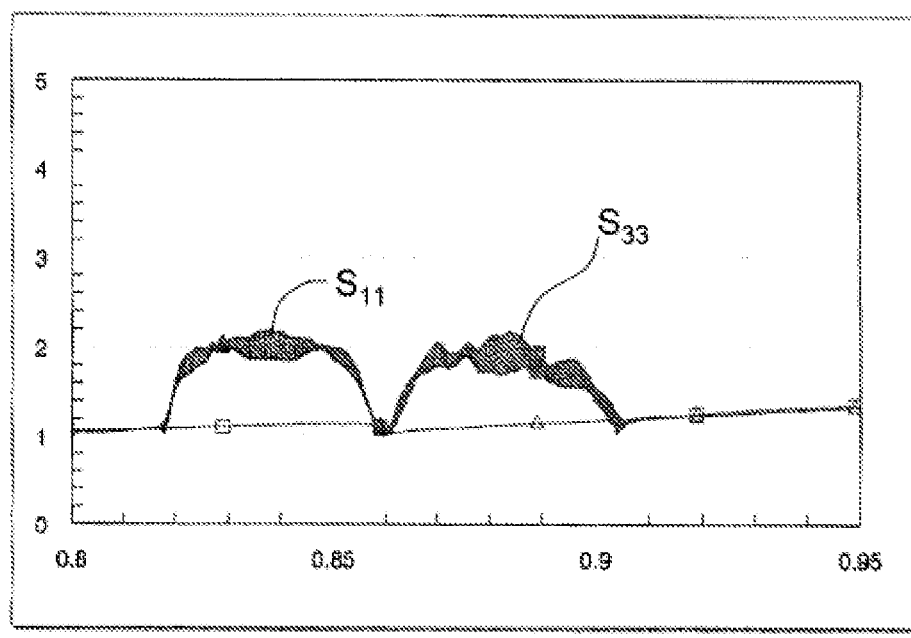
FIG. 10 shows the reflection of an amplifier module according to FIG. 9.

This circuit arrangement improves the isolation of transmission and reception port TX, RX distinctly. FIG. 8 shows the pass band characteristic and the isolation of the amplifier module shown in FIG. 7, a standing-wave ratio of 3:1 of the antenna being used as a basis and the phase angle being increased in steps of 20° from 0° to 360°. FIG. 9 shows a section of the pass band characteristic shown in FIG. 8 and FIG. 10 shows the curves $S_{33}$ and $S_{11}$ for a circuit arrangement shown in FIG. 7. A standing-wave ratio of 3:1 at the antenna is again used as a basis and the phase angle is increased in steps of 20° from 0° to 360°.

A comparison of FIGS. 4 and 8 shows that the isolation between transmission and reception port is improved by more than 10 dB for a circuit arrangement according to the second exemplary embodiment. FIG. 10 also shows that the variation of the standing-wave ratio is improved even in the case of mismatches of the antenna. The fluctuation of the insertion loss is correspondingly very low.

A comparison of FIG. 5 with FIG. 9 shows a reduction of the amplitude ripple in the respective pass band which is an important prerequisite especially for LTE signals.

Figure 11:
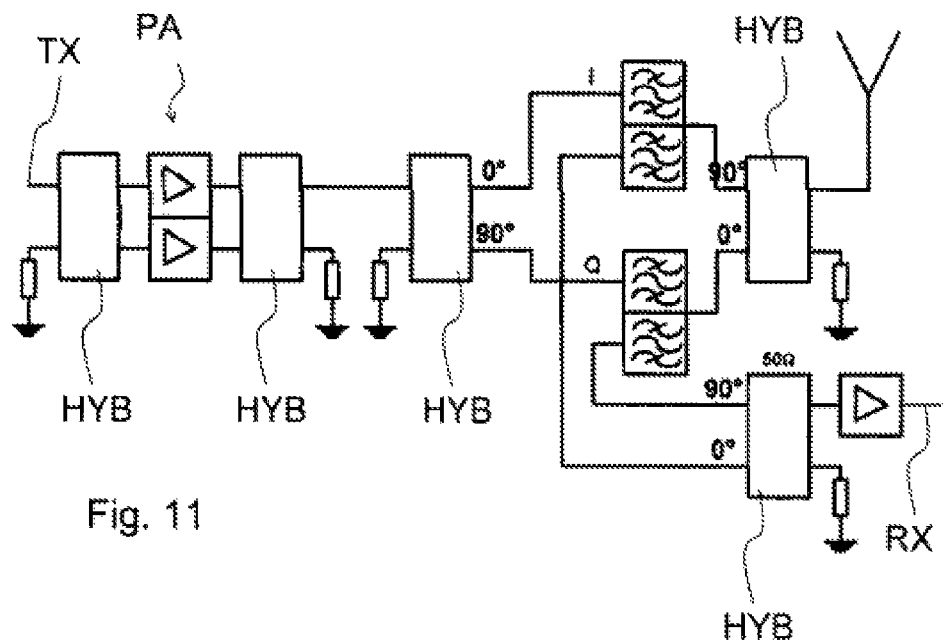
FIG. 11 shows a block diagram of an amplifier module having two amplifier units between two 90° hybrids.

FIG. 11 shows a block diagram (equivalent circuit) of an amplifier module, an I/Q amplifier being interconnected between transmission port TX and the 90° hybrid HYB on the TX side, interconnected with the two duplexers. The I/Q amplifier comprises a hybrid HYB on the TX side and a hybrid HYB on the antenna side. Between the output terminals of the hybrid HYB on the TX side and the input terminals of the hybrid HYB on the antenna side, the two amplifier units of the amplifier PA are interconnected in parallel paths. These amplifier units can comprise low-impedance input or output terminals, respectively. The 90° hybrids HYB interconnected therewith can be correspondingly adapted so that no impedance transformation network needs to be provided directly following the amplifier units. Thus, an amplifier can be obtained which does not need to be specially matched to a 50 Ω output impedance and can therefore operate more energy-efficiently.

Figure 12:
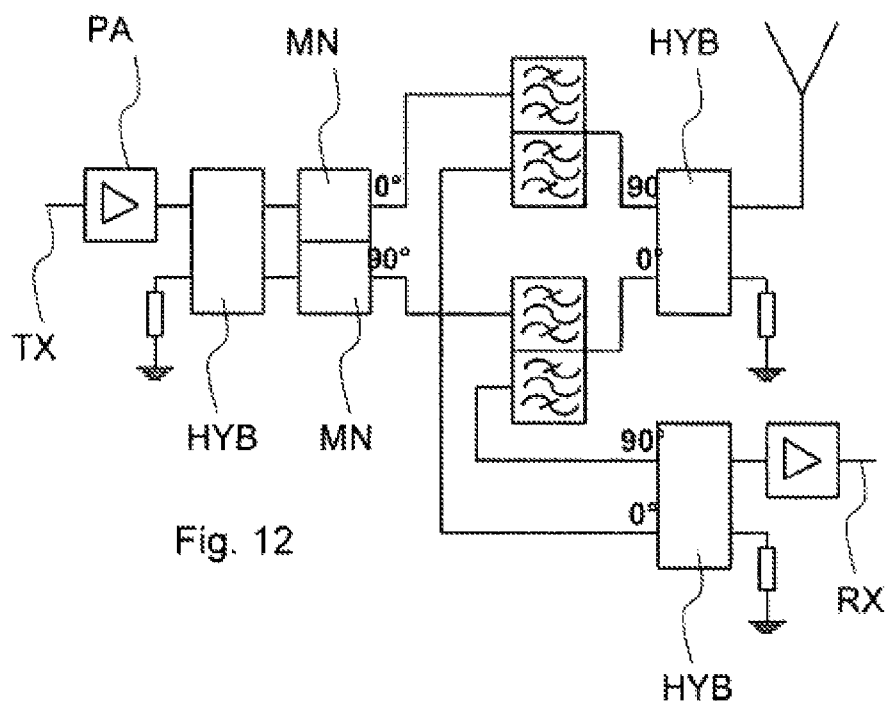
FIG. 12 shows a block diagram of an amplifier module having two impedance transformation networks between a 90° hybrid and two duplexers.

FIG. 12 shows a block diagram of an amplifier module in which a 90° hybrid and, in series therewith, impedance transformation networks MN are inter-connected between an amplifier PA interconnected with the TX port TX, on the one hand, and the duplexers on the other hand. In this arrangement, the impedance transformation switching circuits MN are interconnected between one output of the 90° hybrid each and one of the two duplexers.

Figure 13:
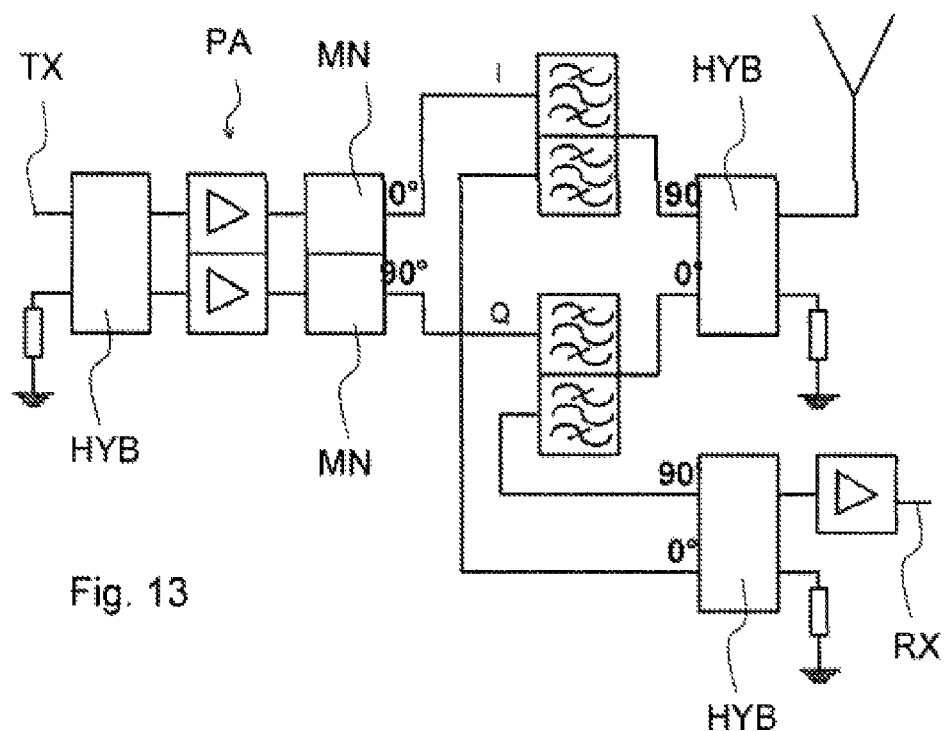
FIG. 13 shows a block diagram of an amplifier module having two amplifier units of an amplifier between a 90° hybrid and two impedance transformation networks.

FIG. 13 shows a block diagram of an amplifier module, a 90° hybrid, two amplifier units of the amplifier PA and two impedance transformation networks MN being interconnected between the transmission port TX and the two duplexers. The 90° hybrid HYB is here interconnected directly to the transmission port TX. One of the impedance transformation networks MN each is interconnected with one of the two duplexers each. The two amplifier units are interconnected on parallel paths between the 90° hybrid HYB and the impedance transformation networks MN.

Figure 14:
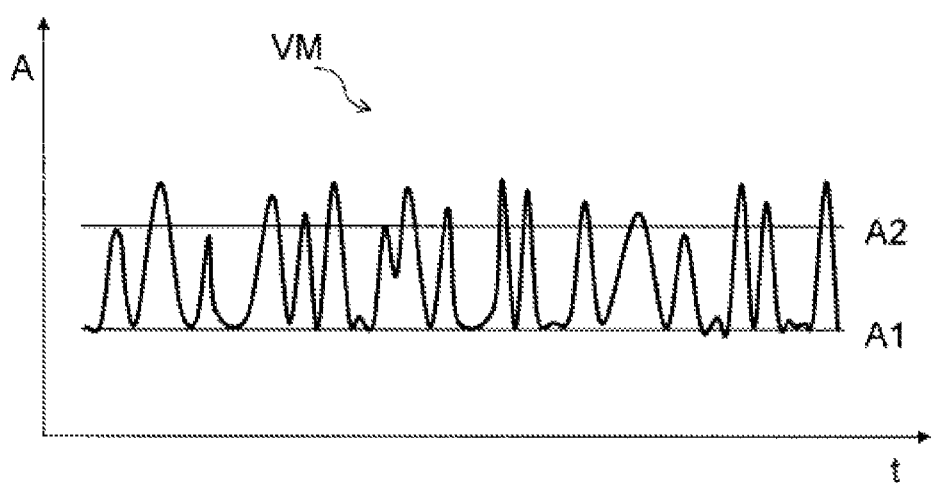
FIG. 14 shows the temporal dependence of the amplitude of the amplification in the supply voltage envelope tracking.

FIG. 14 shows by way of example the time-dependence of the amplitude of the envelope curve of the power signal of an amplifier and in this context illustrates the supply voltage envelope tracking VM. In the case of the supply voltage envelope tracking, the supply voltage of the amplifier of the amplifier module can be adjusted between different amplitudes A1 and A2 in accordance with the current power to be transmitted. In this context, the greater amplitude A2 can also be exceeded for a short time. Overall, the amplifier is supplied with a voltage which is selected in such a manner or matched to the RF signal to be transmitted in such a manner that the amplifier always operates in an optimum operating range and thus very energy-efficiently. The curve shown in FIG. 14 thus represents the envelope curve of an RF signal to be transmitted which determines the supply voltage of the amplifier.

FIG. 15 shows a simple embodiment of an amplifier module operating with supply voltage envelope tracking which comprises an amplifier PA which is interconnected in the signal path SP and an envelope tracker ET as circuit components VMC.

FIG. 16 shows an embodiment of an amplifier module which comprises delay components DC in the signal path SP. Furthermore, a driver circuit DRV is interconnected in the signal path SP. An impedance transformation network MN is interconnected to the output of the amplifier PA.

FIG. 17 shows a block diagram of an amplifier module, the components for supply voltage envelope tracking VMC comprising a switch SW by means of which the envelope tracker ET can be coupled to the signal path SP or separated from it, respectively. Furthermore, there is a switch SW by means of which the amplifier PA, which receives its supply voltage from the envelope tracker ET, can be bypassed if supply voltage envelope tracking is to be omitted.

At the output terminal of the amplifier PA or with the bypass switch SW, an impedance transformation network MN is interconnected, the output of which is interconnected to the TX filter of the duplexer DPX.

All signal paths of an amplifier module can be designed to be balanced, i.e. symmetric to ground, or unbalanced, i.e. asymmetric to ground. In the exemplary representation of FIG. 17, the TX signal path is arranged to be unbalanced whilst an RX output of the RX filter of the duplexer DPX is arranged to be balanced.

FIG. 18 shows an embodiment of the circuit elements of the supply voltage envelope tracking VMC, a coupler C being interconnected in the signal path SP in order to extract a particular percentage of the power of the TX signals and supply it via the envelope tracker ET as supply voltage to the power amplifier PA.

Figure 19:
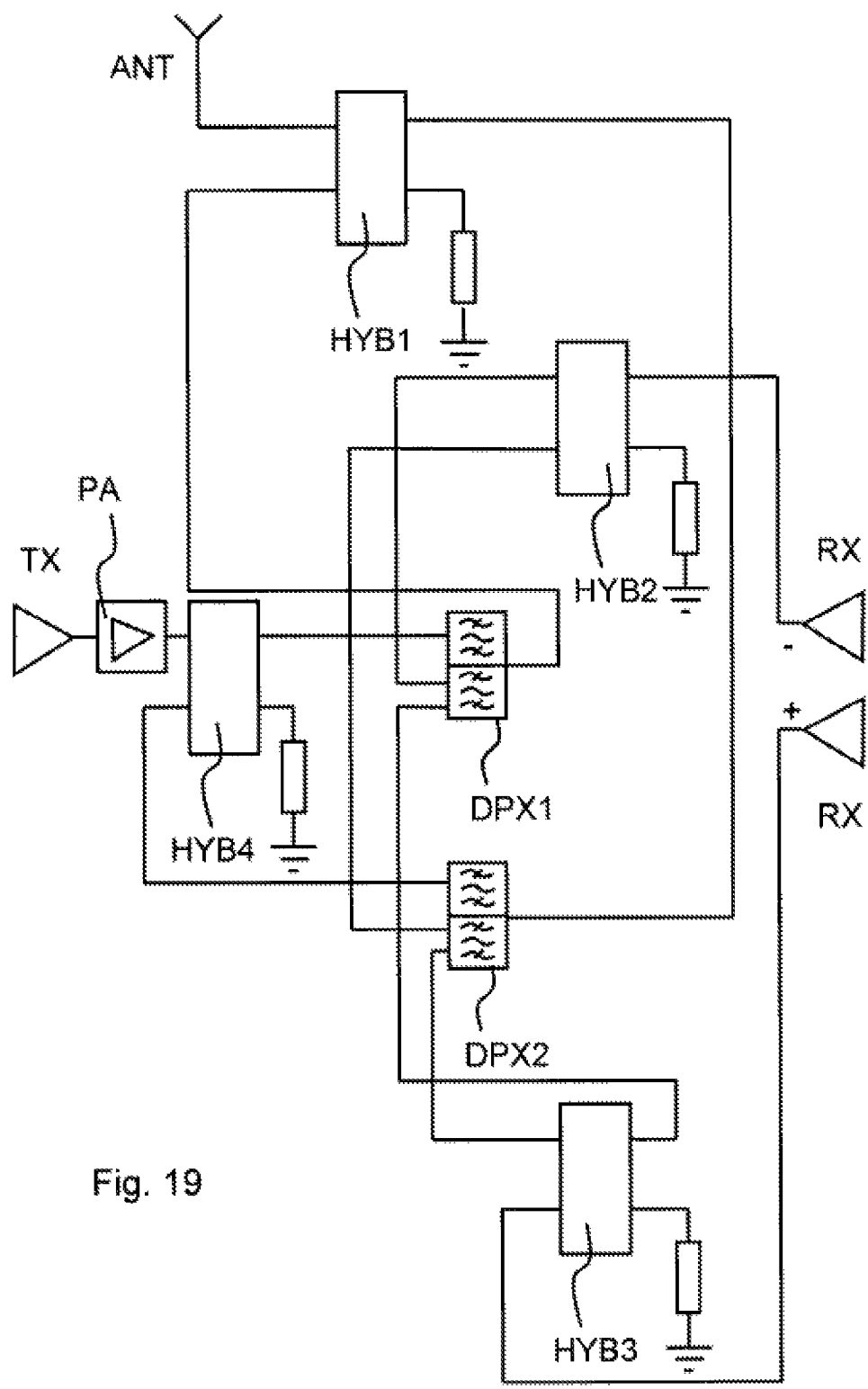
FIG. 19 shows the block diagram of an amplifier module comprising a symmetric Rx port.

FIG. 19 shows the block diagram of an amplifier module comprising a balanced Rx port. Compared with the embodiments having exclusively unbalanced ports as is explained, for example, by means of FIG. 7, an additional hybrid is required here.

The amplifier module has two duplexers DPX1, DPX2 and four 90° hybrids HYB1, HYB2, HYB3, HYB4. The transmission port TX is connected to a first terminal of the 90° hybrid HYB4. An input signal which is present at this terminal is output again by the 90° hybrid HYB4 to two further terminals, the signals output being phase shifted by 90° with respect to one another and having a signal strength which is less by about 3 dB compared with the input signal. These two outputs are interconnected with in each case one duplexer DPX1, DPX2. The other hybrids, too, can be designed similarly or identically and in each case output an input signal again in the form of two mutually phase shifted outputs.

The outputs of the two duplexers DPX1, DPX2 on the antenna side are combined at the antenna ANT by means of a further hybrid HYB1.

The duplexers DPX1, DPX2 have in each case a balanced Rx output with two terminals for a balanced signal transmission. In each case one of the terminals of the Rx output of the two duplexers is connected to the input of one hybrid HYB2, HYB3 in each case. The two signals are added there in the correct phase and output at an output and supplied to the respective terminal of the Rx port RX.

Between the Tx port TX and the first hybrid HYB4, an amplifier PA is arranged. Otherwise, the same principles of action and advantages as explained by means of the previous exemplary embodiments apply here, too. It is found that an amplifier module having a balanced Rx port can be implemented with only one additional hybrid (compared with an amplifier module having an asymmetric Rx port).

The invention claimed is:
1. An amplifier module comprising:
   at least one amplifier;
   an antenna port;
   a transmission port;
   a reception port; and
   a circuit arrangement comprising at least three 90° hybrids which in each case divide an input signal into two output signals, the two output signals having a relative phase shift of 90° with respect to one another,
   wherein the antenna port, the transmission port and the reception port are in each case connected to at least one 90° hybrid,
   wherein at least one of the amplifiers is interconnected in series between the transmission port and one of the 90° hybrids,
   wherein the 90° hybrids are constructed from discrete elements or comprise microstrip lines.
2. The amplifier module according to claim 1, wherein the circuit arrangement also has at least two duplexers which are interconnected in such a manner that the two output signals which the 90° hybrid connected to the transmission port outputs interfere constructively at the antenna port.
3. The amplifier module according to claim 2, wherein the three terminals of each of the two duplexers are connected in each case to one of the three 90° hybrids.
4. The amplifier module according to claim 2 or 3, wherein one of the two duplexers is connected to the 90° hybrid connected to the reception port and to the 90° hybrid connected to the transmission port in such a manner that the 90° hybrids in each case output an output signal phase shifted by the angle $\Phi_1$ relative to their input signal to the duplexer,
   wherein the other one of the two duplexers is connected to the 90° hybrid connected to the reception port and to the 90° hybrid connected to the transmission port in such a manner that the 90° hybrids in each case output an output signal phase shifted by the angle $\Phi_2$ relative to their input signal to the duplexer,
   wherein the amount of the difference of the two angles $\Phi_1$ and $\Phi_2$ is mainly 90°, and
   wherein both duplexers are in each case connected to one of the outputs of the 90° hybrid connected to the antenna port.
5. The amplifier module according to claim 2, wherein the duplexers are constructed of discrete elements or contain acoustic components.
6. The amplifier module according to claim 5, wherein the duplexers comprise SAW duplexers, BAW duplexers or hybrid duplexers having both SAW transducers and BAW transducers.
7. The amplifier module according to claim 2, wherein the duplexers have high-pass and low-pass filters.
8. The amplifier module according to claim 2, wherein the duplexers have tunable elements.
9. The amplifier module according to claim 2, wherein the duplexers or the 90° hybrids are integrated into a module substrate.
10. The amplifier module according to claim 9, wherein the duplexers or the 90° hybrids are integrated into a multi-layered module substrate in the form of L-, C— and R-elements.
11. The amplifier module according to claim 2, which has two amplifiers, wherein the first amplifier is interconnected in series between the 90° hybrid connected to the transmission port and the first duplexer, and
   wherein the second amplifier is interconnected in series between the 90° hybrid connected to the transmission port and the second duplexer.
12. An amplifier module comprising:
   at least one amplifier;
   an antenna port;
   a transmission port;
   a reception port; and
   a circuit arrangement comprising at least three 90° hybrids which in each case divide an input signal into two output signals, the two output signals having a relative phase shift of 90° with respect to one another,
   wherein the antenna port, the transmission port and the reception port are in each case connected to at least one 90° hybrid,
   wherein at least one of the amplifiers is interconnected in series between the transmission port and one of the 90° hybrids, and
   wherein the amplifier module is designed for the LTE frequency band XI or the LTE frequency band VII.
13. An amplifier module, comprising:
   at least one amplifier;
   an antenna port;
   a transmission port;
   a reception port; and
   a circuit arrangement comprising at least three 90° hybrids which in each case divide an input signal into two output signals, the two output signals having a relative phase shift of 90° with respect to one another,
   wherein the antenna port, the transmission port and the reception port are in each case connected to at least one 90° hybrid,
   wherein at least one of the amplifiers is interconnected in series between the transmission port and one of the 90° hybrids,
   wherein one of the ports is a balanced port and has two mutually balanced terminals, and
   wherein each of the two balanced terminals is connected to a 90° hybrid.
14. An amplifier module, comprising:
   at least one amplifier;
   an antenna port;
   a transmission port;
   a reception port; and
   a circuit arrangement comprising at least three 90° hybrids which in each case divide an input signal into two output signals, the two output signals having a relative phase shift of 90° with respect to one another,
   wherein the antenna port, the transmission port and the reception port are in each case connected to at least one 90° hybrid,
   wherein at least one of the amplifiers is interconnected in series between the transmission port and one of the 90° hybrids, and
   wherein at least one of the amplifiers or at least one 90° hybrid comprises a low-impedance output stage.
15. An amplifier module, comprising:
   at least one amplifier;
   an antenna port;
   a transmission port;
   a reception port;
   a circuit arrangement comprising at least three 90° hybrids which in each case divide an input signal into two output signals, the two output signals having a relative phase shift of 90° with respect to one another, wherein the antenna port, the transmission port and the reception port are in each case connected to at least one 90° hybrid, and wherein at least one of the amplifiers is interconnected in series between the transmission port and one of the 90° hybrids; and an impedance transformation network after one of the amplifiers or one of the 90° hybrids.

16. An amplifier module, comprising:
at least one amplifier;
an antenna port;
a transmission port;
a reception port;
a circuit arrangement comprising at least three 90° hybrids which in each case divide an input signal into two output signals, the two output signals having a relative phase shift of 90° with respect to one another,
wherein the antenna port, the transmission port and the reception port are in each case connected to at least one 90° hybrid,
wherein at least one of the amplifiers is interconnected in series between the transmission port and one of the 90° hybrids; and
an I/Q amplifier having 2 amplifier units and two 90° hybrids.

17. An amplifier module comprising:
at least one amplifier;
an antenna port;
a transmission port;
a reception port;
a circuit arrangement comprising at least three 90° hybrids which in each case divide an input signal into two output signals, the two output signals having a relative phase shift of 90° with respect to one another,
wherein the antenna port, the transmission port and the reception port are in each case connected to at least one 90° hybrid,
wherein at least one of the amplifiers is interconnected in series between the transmission port and one of the 90° hybrids;
a first impedance transformation network interconnected with a first output of a 90° hybrid; and
a second impedance transformation network interconnected with a second output of a 90° hybrid.

18. An amplifier module comprising:
at least one amplifier;
an antenna port;
a transmission port;
a reception port;
a circuit arrangement comprising at least three 90° hybrids which in each case divide an input signal into two output signals, the two output signals having a relative phase shift of 90° with respect to one another,
wherein the antenna port, the transmission port and the reception port are in each case connected to at least one 90° hybrid,
wherein at least one of the amplifiers is interconnected in series between the transmission port and one of the 90° hybrids;
a first amplifier unit interconnected between a first output of a 90° hybrid and a first impedance transformation network; and
a second amplifier unit interconnected between a second output of a 90° hybrid and a second impedance transformation network.

19. An amplifier module comprising:
at least one amplifier;
an antenna port;
a transmission port;
a reception port;
a circuit arrangement comprising at least three 90° hybrids which in each case divide an input signal into two output signals, the two output signals having a relative phase shift of 90° with respect to one another,
wherein the antenna port, the transmission port and the reception port are in each case connected to at least one 90° hybrid,
wherein at least one of the amplifiers is interconnected in series between the transmission port and one of the 90° hybrids; and
a voltage modulator for an amplifier or an amplifier unit.

20. An amplifier module comprising:
at least one amplifier;
an antenna port;
a transmission port;
a reception port;
a circuit arrangement comprising at least three 90° hybrids which in each case divide an input signal into two output signals, the two output signals having a relative phase shift of 90° with respect to one another,
wherein the antenna port, the transmission port and the reception port are in each case connected to at least one 90° hybrid,
wherein at least one of the amplifiers is interconnected in series between the transmission port and one of the 90° hybrids; and
a coupler for extracting a control signal for envelope tracking of the supply voltage of an amplifier or of an amplifier unit.

21. An amplifier module comprising:
at least one amplifier;
an antenna port;
a transmission port;
a reception port;
a circuit arrangement comprising at least three 90° hybrids which in each case divide an input signal into two output signals, the two output signals having a relative phase shift of 90° with respect to one another,
wherein the antenna port, the transmission port and the reception port are in each case connected to at least one 90° hybrid,
wherein at least one of the amplifiers is interconnected in series between the transmission port and one of the 90° hybrids; and
a detector for detecting the necessary supply voltage of an amplifier or of an amplifier unit.

22. An amplifier module comprising:
at least one amplifier;
an antenna port;
a transmission port;
a reception port;
a circuit arrangement comprising at least three 90° hybrids which in each case divide an input signal into two output signals, the two output signals having a relative phase shift of 90° with respect to one another,
wherein the antenna port, the transmission port and the reception port are in each case connected to at least one 90° hybrid,
wherein at least one of the amplifiers is interconnected in series between the transmission port and one of the 90° hybrids; and a delay element in the signal path before an amplifier or an amplifier unit.

23. An amplifier module comprising:
- at least one amplifier;
- an antenna port;
- a transmission port;
- a reception port;
- a circuit arrangement comprising at least three 90° hybrids which in each case divide an input signal into two output signals, the two output signals having a relative phase shift of 90° with respect to one another,
- wherein the antenna port, the transmission port and the reception port are in each case connected to at least one 90° hybrid,
- wherein at least one of the amplifiers is interconnected in series between the transmission port and one of the 90° hybrids;
- circuit elements for supply voltage envelope tracking; and
- a switch for deactivating the circuit elements for the supply voltage envelope tracking.

\* \* \* \* \*